United States Patent [19]
Plies et al.

[11] Patent Number: 5,661,400
[45] Date of Patent: Aug. 26, 1997

[54] ANTENNA FOR NUCLEAR MAGNETIC RESONANCE TOMOGRAPHY

[75] Inventors: Erich Plies, Tuebingen; Alejandro Valenzuela, Haar, both of Germany

[73] Assignee: Siemens Aktiengesellschaft, Munich, Germany

[21] Appl. No.: 629,170

[22] Filed: Apr. 8, 1996

[30] Foreign Application Priority Data

Apr. 7, 1995 [DE] Germany .................. 195 13 231.9

[51] Int. Cl.$^6$ .................................................. G01V 3/00
[52] U.S. Cl. ..................................... 324/318; 324/322
[58] Field of Search .............................. 324/322, 318, 324/314, 309, 307, 300

[56] References Cited

U.S. PATENT DOCUMENTS 4,714,887  12/1987  Meissner et al. .................. 324/318
5,276,398   1/1994  Withers et al. .................... 324/318
5,565,778  10/1996  Brey et al. ........................ 324/318

OTHER PUBLICATIONS

"High Q Coplanar Transmission Line Resonator of $Yba_2Cu_3O_{7-x}$ on MgO," Valenzuela et al., Appl. Phys. Lett. vol. 55, No. 10, Sep. 4, 1989 (pp. 1029–1031).

*Primary Examiner*—Louis M. Arana
*Attorney, Agent, or Firm*—Hill, Steadman & Simpson

[57] ABSTRACT

An antenna for nuclear magnetic resonance tomography has at least one annulus antenna surrounded by a passive layer of superconductor material, so that an optimally uniform magnetic field and an optimally high signal-to-noise ratio are assured during operation.

9 Claims, 2 Drawing Sheets

ANTENNA FOR NUCLEAR MAGNETIC RESONANCE TOMOGRAPHY

BACKGROUND OF THE INVENTION

1. Field of the Invention

The present invention is directed to an antenna, especially of superconductive material, for medical applications in nuclear magnetic resonance tomography.

2. Description of the Prior Art

In nuclear magnetic resonance tomography utilized in medical diagnostics, atomic nuclei with a magnetic moment in the examination subject are excited into higher-energy conditions in the human body by pulsed magnetic fields, these conditions being defined by a static magnetic field. Relaxation processes determine the return of the nuclei into the low-energy condition. Radio-frequency signals are thereby emitted that are measured, interpreted and displayed in the form of tomograms. Specific radio-frequency antennas operated in the near field are required for this purpose that can pick up the very low levels of the emitted nuclear signals with a high signal-to-noise ratio.

The amplitude of the radio-frequency signal of the relaxing spins is proportional to the Larmor frequency, to the transverse radio-frequency component of the antenna relative to the static magnetic field and to the local magnetization in the volume element in which the emitted signal originates. In identifying the location-dependency of this amplitude it is not possible to distinguish whether, for example, the local magnetization is responsible for a specific signal quantity or whether the transverse radio-frequency component is responsible for a specific signal quantity. A drastic falsification of the image content can thereby arise. An antenna employed in nuclear magnetic resonance tomography should therefore supply an optimally location-independent amplitude in the entire volume under investigation. Since the magnetization as well as the Larmor frequency increase proportionally with the static magnetic field, the amplitude of the signal detectable by the antenna increases approximately quadratically with the frequency, whereas the noise simultaneously emitted by the body increases only linearly with the frequency. In addition to repeated measurements with data acquisition and switching from linear to circular polarization, an enhancement of the signal-to-noise ratio is mainly achieved by a boost of the frequency, or of the static magnetic field connected therewith. The upper limit of the usable range of field strength is established by the already highly pronounced standing wave and resonance effects in the conductive body tissue that influence imaging of structure lying deep under the skin. Standard systems therefore operate in a static field strength range from 1 through 4 T. Complicated superconductive coils are required in order to achieve these high magnetic field strengths. Systems with normally (room temperature) conductive magnetic field coils or permanent magnets can only manage to produce a static field with a field strength in a range from 0.2 through 0.5 T. Above all, the low signal-to-noise ratio limits the resolution of the system in this low-frequency range.

When only a relatively small subject region is to be imaged, then the noise emitted by the body can be reduced by making the antenna radius smaller. Such small radius antennas are referred to as surface coils or local coils. Annulus antennas are mainly used for this purpose. The limit of miniaturization is established by the set noise of the antenna and the reduction in size of the imaging volume. Such surface coils generally exhibit relatively poor homogeneity, and in order to avoid the inhomogeneity from making a significant (detrimental) contribution to the image result, the far more homogeneous whole-body coil is used for transmission. The resonant frequency of the surface coil must then be detuned during the transmission phase so that the resonant frequency of the whole-body antenna is not varied and so that the possibility of focussing of radio-frequency power onto the organ under examination due to resonant coupling with the surface antenna is suppressed in all cases. Very complicated detuning circuits thereby become necessary for safety reasons.

SUMMARY OF THE INVENTION

An object of the present invention is to provide an antenna for nuclear magnetic resonance tomography that has a more beneficial signal-to-noise ratio than has been conventionally attainable.

This object is achieved in accordance with the principles of the present invention in an antenna arrangement constructed in multi-layer technique for the surface coil wherein the layers in either thin-film or thick-film technique, are composed of superconductor material. In an embodiment of the invention, the annulus antenna that generates and/or detects the magnetic field is composed of a superconductor. In addition to the annulus antenna, at least one superconductor layer is spatially arranged such that a homogenization and/or an increase of the field strength of the high-frequency magnetic field relevant for the application is achieved in the imaging volume. Known materials are employed as superconductor material, for example $YBa_2Cu_3O_{7-}$. Whereas type I superconductors should only be operated in the complete Meissner phase, i.e. below the critical magnetic field, type II superconductors such as, for example, oxidic high-temperature superconductors can also be operated in the Shubnikov phase above the lower critical magnetic field and below the upper critical magnetic field when the noise component of the received or enclosed flux is kept small compared to the largest noise source of the system, for example by adequate noise pinning. The set noise of the annulus antenna is minimized by the extremely slight loss due to resistance of the superconductor. The radius of the annulus antenna can be selected significantly smaller for optimizing the signal-to-noise ratio, as a result the noise power emitted by the body is reduced and the overall noise power of the system can be minimized. In order to enlarge the imaging volume made smaller by the miniaturization of the antenna, an antenna of many identical annulus antennas arranged matrix-like can be employed in accordance with the invention.

These individual annulus antennas can be driven serially or in parallel for the transmission and/or reception of the high-frequency magnetic field. Alternatively, an array as described in P. B. Roemer, W. A. Edelstein, S. P. Souza, C. E. Hayes, O. M. Mueller, "Simultaneous multiple surface coil NMR imaging", Proc. of the SMRM, San Francisco, Vol.2 (1988) p.875 can be provided.

The Meissner effect, which leads to the fact that the magnetic field does not penetrate into the superconductor, is exploited in the inventive arrangement. The result achieved is that the additional superconductor layer bundles the magnetic field such that it is especially uniform in the region of the body volume under examination or at least such that a predetermined gradient of the magnetic field strength can be set in this volume. As a result of the gain in signal-to-noise ratio and in uniformity of the magnetic field given the inventive arrangement, the antenna can be operated both in the transmission as well as in the reception made with a significantly lower transmission power than in the case of a conventional arrangement is being required. A complicated detuning circuit thereby also becomes superfluous. As a result of the noise contribution of the antenna being negligible compared to the body noise, the imaging volume can be continuously set (adjusted) by varying the distance of the antenna from the volume element to be measured.

DESCRIPTION OF THE PREFERRED EMBODIMENTS

Figure 1:
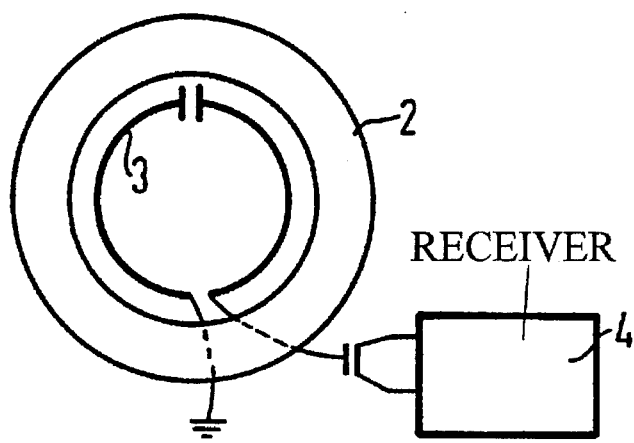
FIG. 1 shows the pattern of an inventive antenna in plan view.
Figure 2:
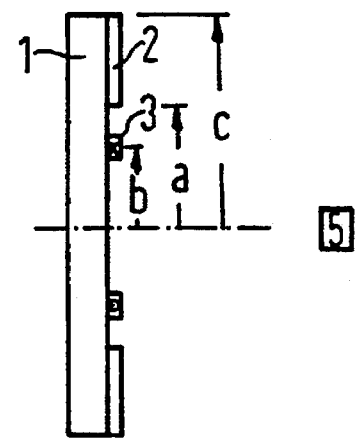
FIG. 2 shows an inventive antenna in cross-section.

FIG. 1 shows an annulus antenna 3 that is connected to a receiver 4 and has an annular layer 2 of superconductor material that surrounds the annulus antenna 3 on all sides. This arrangement is shown in cross-section in FIG. 2. A substrate 1 of electrically insulating material, for example an LaAlO$_3$ crystal, is provided onto which a uniform layer 2 of superconductor material, for example YBa$_2$Cu$_3$O$_{7-}$, is applied in a known way and photolithographically structured. In this exemplary embodiment, the material of the substrate 1 is selected such that the superconductor material can be epitaxially grown thereon. The manufacture of a planar arrangement of a superconductor is known (A. A. Valenzuela, P. Russer, "High Q coplanar transmission line resonator of YBa$_2$Cu$_3$O$_{7-x}$ on MgO", Appl.Phys. Lett.55 (10), (1989) pp.1029–1031). The entered dimensions in this exemplary embodiment amount to a=12 mm for the inside radius of the layer 2 of superconductor material and b=10.5 mm for the average radius of the annulus antenna, and c=35 mm for the outside radius of the superconductor layer 2. The square provided with reference numeral 5 symbolizes the imaging volume to be examined.

As can be seen in FIG. 1, the annular layer of superconducting material is continuous and has no leads for actively supplying a signal thereto or receiving a signal therefrom, i.e., it is "passive." Only the annulus antenna 3 has a lead connecting it to the receiver 4.

Figure 3:
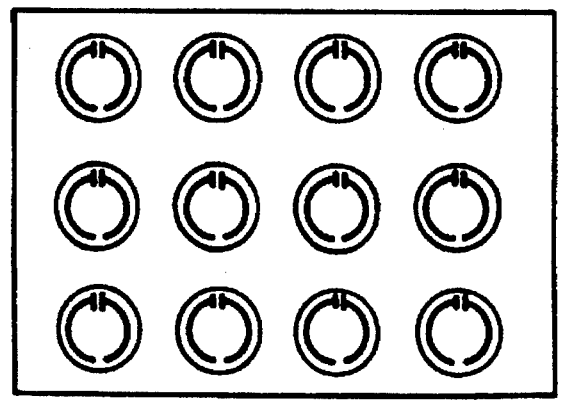
FIG. 3 shows an inventive antenna with a matrix-like arrangement of individual annulus antennas in plan view.
Figure 4:
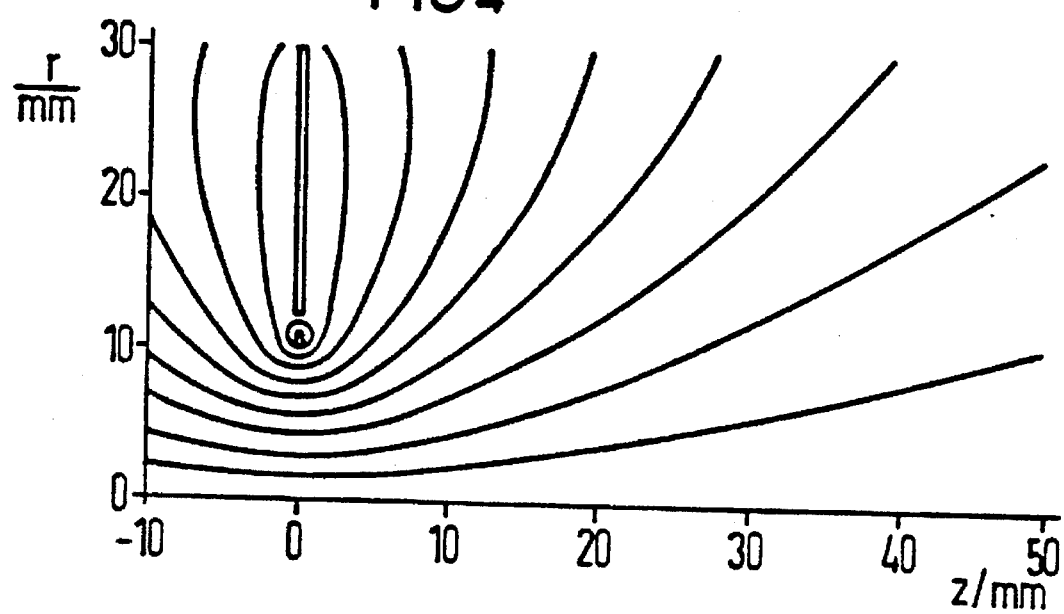
FIGS. 4 and 5 are diagrams for illustrating the field of an inventive antenna as shown in FIG. 3.
Figure 5:
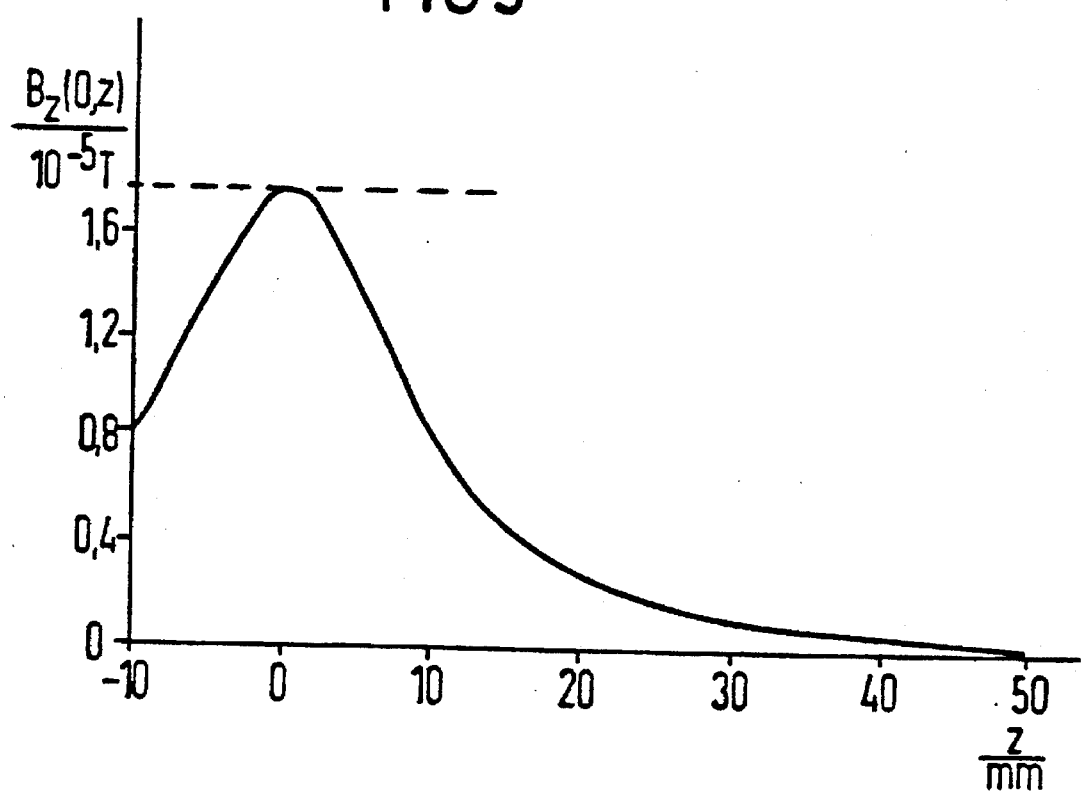

FIG. 4 shows the field lines for the arrangement of FIG 3. The direction perpendicular to the surface of the substrate 1 is entered on the abscissa. The distance from the center axis of the circle formed by the annulus antenna 3 is entered on the ordinate. The complete set of spatial field lines is obtained by rotation of this pattern at the abscissa. The axial magnetic field, i.e. the z-component of B on the center axis, dependent on the z-coordinate is entered in the unit T (Tesla) in FIG. 5.

A maximum of B$_z$ of $1.66 \times 10^{-5}$ T was determined for a current of 200 Ma in the annulus antenna and an annular layer 2 of high-temperature superconductor material. B$_z$ amounted to $8.0 \times 10^{-6}$ T on the axis at the distance of 10 mm from the plane of the annulus antenna 3. A 38% improvement thus arose compared to an arrangement without the superconductor, annular layer 2 (a value of $1.2 \times 10^{-5}$ T for the maximum B$_z$ derived for this simplified arrangement). It may be seen from FIG. 4 that the field lines given the inventive arrangement are relatively uniform even at a distance from the plane of the annulus antenna, at least in the axial region critical for the examination. The uniformity of the generated magnetic field and the sensitivity of the antenna can be advantageously set by modifying the dimensions of the annulus antenna and of the superconductor layer 2.

The connection of an amplifier or receiver 4 to the annulus antenna 3 ensues in the standard way. The annulus of the annulus antenna 3 that generates or detects the magnetic field can also have a number of conductor loops arranged in a planar sprial.

Dependent on the critical temperature of the superconductor employed, cooling of the inventive antenna can ensue, for example, with liquid nitrogen or with the assistance of a miniature cooler in a known way.

FIG. 3 shows the matrix-like arrangement of a number of annulus antennae 3 on, for example, a substrate, whereby the superconductor layer 2 is applied Surface-wide and has circular recesses in which the annulus antennae are respectively arranged.

Although modifications and changes may be suggested by those skilled in the art, it is the intention of the inventors to embody within the patent warranted hereon all changes and modifications as reasonably and properly come within the scope of their contribution to the art.

We claim as our invention:

1. An antenna for nuclear magnetic resonance tomography, comprising at least one annulus antenna for active operation in a plane and at least one continuous layer of passive superconductor material disposed in a plane that is coplanar with the plane of said annulus antenna.

2. An antenna as claimed in claim 1, wherein the layer of superconductor material is disposed in the same plane as the annulus antenna.

3. An antenna as claimed in claim 2, wherein the layer of superconductor material surrounds the annulus antenna on all sides.

4. An antenna as claimed in claim 3, wherein the layer of superconductor material is an annulus.

5. An antenna as claimed in claim 3, wherein the layer of superconductor material has a maximum distance of 1.5 mm from the annulus antenna.

6. An antenna as claimed in claim 1, further comprising an electrically insulating substrate on which said annulus antenna and the layer of superconductor material are applied.

7. An antenna as claimed in claim 1, wherein a plurality of annulus antennae are arranged matrix-like.

8. An antenna as claimed in claim 1, wherein said annulus antenna comprises superconductor material.

9. An antenna as claimed in claim 1, wherein the superconductor material is a high-temperature superconductor.

* * * * *